United States Patent [19]

Bulat et al.

[11] Patent Number: 5,106,770

[45] Date of Patent: Apr. 21, 1992

[54] METHOD OF MANUFACTURING SEMICONDUCTOR DEVICES

[75] Inventors: Emel S. Bulat; Richard M. Klein, both of Framingham, Mass.

[73] Assignee: GTE Laboratories Incorporated, Waltham, Mass.

[21] Appl. No.: 614,772

[22] Filed: Nov. 16, 1990

[51] Int. Cl.$^5$ .................................. H01L 21/265
[52] U.S. Cl. ..................................... 437/40; 437/38; 437/24; 437/67; 437/911; 148/DIG. 88
[58] Field of Search ............... 437/911, 38, 67, 63, 437/72, 24; 148/DIG. 88

[56] References Cited

U.S. PATENT DOCUMENTS

| | | | |
|---|---|---|---|
| 4,104,086 | 8/1978 | Bondur et al. | 437/81 |
| 4,375,124 | 3/1983 | Cogan | 437/162 |
| 4,543,706 | 10/1985 | Bencuya et al. | 437/911 |
| 4,566,172 | 1/1986 | Bencuya et al. | 437/38 |
| 4,611,384 | 9/1986 | Bencuya et al. | 437/911 |
| 4,651,407 | 3/1987 | Bencuya et al. | 437/911 |
| 4,713,358 | 12/1987 | Bulat et al. | 437/911 |
| 4,885,054 | 12/1989 | Shibagaki | 156/662 |

OTHER PUBLICATIONS

Ohyu et al., "Improvement of SiO$_2$/Si Interface Properties Utilizing Fluorine Ion Implantation and Drive-In Diffusion", Japanese Journal of Applied Physics; vol. 28; No. 6; Jun. 1989; pp. 1041–1045.

*Primary Examiner*—Brian E. Hearn
*Assistant Examiner*—Trung Dang
*Attorney, Agent, or Firm*—Victor F. Lohmann, III

[57] ABSTRACT

In the fabrication of a junction field effect transistor, specifically a static induction transistor, an epitaxial layer of high resistivity N-type silicon is grown on a substrate of low resistivity N-type silicon. A plurality of elongated parallel grooves separated by interposed ridges are formed by reactive ion etching. A layer of silicon oxide is grown on all exposed surfaces including the side walls and bottoms of the grooves. Fluorine is ion implanted into the silicon oxide. The grooves are filled with deposited silicon oxide or polycrystalline silicon, and material is removed to form a flat planar surface with the silicon at the surfaces of the ridges exposed. P-type doping material is ion implanted into alternate (gate) ridges. The wafer is heated to diffuse the P-type doping material and form gate regions. Heating also activates the implanted fluorine ions which react with unbonded silicon atoms at the silicon oxide-silicon interface thus quenching vacant bond sites. N-type doping material is ion implanted in the top of the intervening (source) ridges. Metal contacts are applied to the gate ridges, source ridges, and the bottom of the substrate.

15 Claims, 3 Drawing Sheets

METHOD OF MANUFACTURING SEMICONDUCTOR DEVICES

This invention was made with government support under contract number F33657-87-C-3365 awarded by the Department of the Air Force. The government has certain rights in this invention.

BACKGROUND OF THE INVENTION

This invention relates to semiconductor devices. More particularly, it is concerned with methods of fabricating semiconductor device structures having trenches or grooves therein.

One type of semiconductor device which is capable of operation at relatively high frequency and power is the static induction transistor. The static induction transistor generally uses vertical geometry with source and drain electrodes placed on opposite sides of a thin, high resistivity layer of one conductivity type. Gate regions of the opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, a source-drain current and voltage derived from an attached energy source will also vary.

Improved static induction transistors having recessed gate structures and methods of manufacturing such devices are described in U.S. Pat. No. 4,611,384 issued Sep. 16, 1986, to Bencuya, et al. and U.S. patent application Ser. No. 403,621, filed Sep. 6, 1989, by Bulat, et al. and assigned to the assignee of the present invention. The structures of these and other related devices have silicon to silicon oxide interfaces at which surface state charges accumulate causing leakage currents to flow thus degrading device performance.

SUMMARY OF THE INVENTION

An improved method of fabricating a semiconductor device structure in accordance with the present invention comprises providing a body of silicon and forming a groove in the body of silicon at a surface thereof. Layers of silicon oxide are formed on the side walls and bottom of the groove. Fluorine is introduced into the layers of silicon oxide, and the body is heated to activate the fluorine.

In another aspect of the invention a junction field effect transistor is fabricated by providing a body of silicon which includes a first layer of one conductivity type of relatively high resistivity and a second layer of the one conductivity type of relatively low resistivity contiguous with the first layer. The first layer has a surface at a surface of the body. A plurality of grooves are formed through the surface into the first layer of silicon to produce interposed ridges of silicon. Each of the grooves has side walls formed by the adjacent ridges of silicon and has a bottom. Alternate ridges are designated as gate ridges and intervening ridges are designated as source ridges. Layers of silicon oxide are formed on the side walls and bottoms of the grooves. Fluorine is introduced into the layers of silicon oxide. The remainder of the grooves are filled with a nonconductive, protective material to produce a continuous surface. Conductivity type imparting material of the opposite conductivity type is introduced into the gate ridges of silicon at the surfaces to convert zones of the first layer to the opposite conductivity type thereby forming gate regions of the opposite conductivity type. Conductivity type imparting material of the one conductivity type is introduced into the source ridges of silicon at the surfaces to produce a source region of the one conductivity type of relatively low resistivity in a zone adjacent to the surface in each of the source ridges. Conductive material is applied to form electrical contacts in ohmic contact with the source and gate regions at the surfaces of the source and gate ridges, respectively.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

In fabricating junction field effect transistors of the static induction type in accordance with the invention as illustrated in the figures, a substrate of single crystal semiconductor material of one conductivity type is provided as a supporting structure. As is well understood, the substrate is usually a slice or wafer of relatively large surface area. For purposes of illustration, however, the fabrication of only a portion of a single static induction transistor in a fragment of a slice will be shown and described. In the following description silicon is employed as the semiconductor material and the substrate is of relatively low resistivity N-type conductivity.

Figure 1:
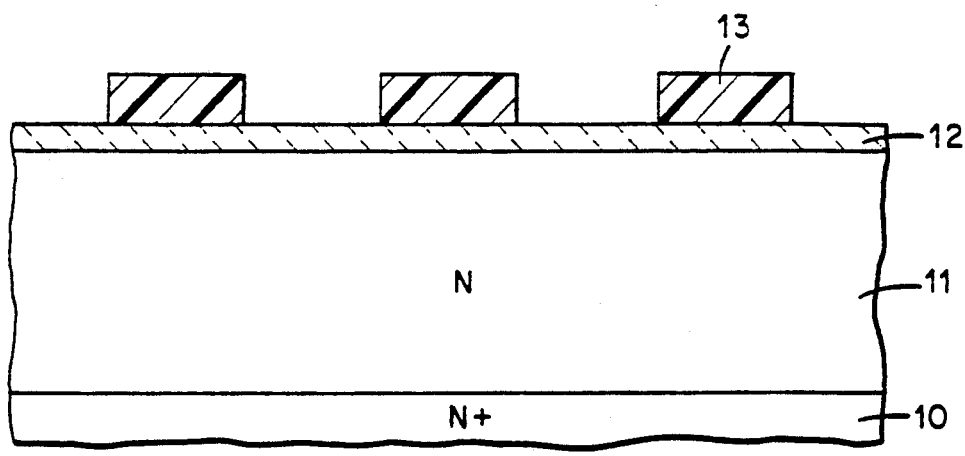
FIGS. 1-7 are a series of elevational views in cross-section of a fragment of a wafer of silicon illustrating successive stages in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the the known techniques of crystal fabrication including appropriate slicing and cleaning operations. An epitaxial layer 11 which is precisely controlled as to thickness and as to resistivity and which is a continuation of the crystalline structure of the single crystal substrate 10 is then grown on the surface of the substrate. The upper surface of the epitaxial layer 11 is parallel to the interface between the substrate and the layer.

The surface of the wafer is covered with an adherent protective layer of silicon oxide 12. The silicon oxide layer 12 is covered with a layer 13 of photoresist material. By employing standard photoresist masking and etching techniques portions of the photoresist layer are removed to expose the surface of the silicon oxide 12 in a pattern of elongated parallel areas. The wafer is etched to remove the exposed silicon oxide 12 by anisotropically etching in a plasma etching apparatus. The photoresist 13 serves as a mask during this operation so that only the exposed silicon oxide is removed to the underlying surface of the epitaxial layer. The photoresist 13 is then removed.

Figure 2:
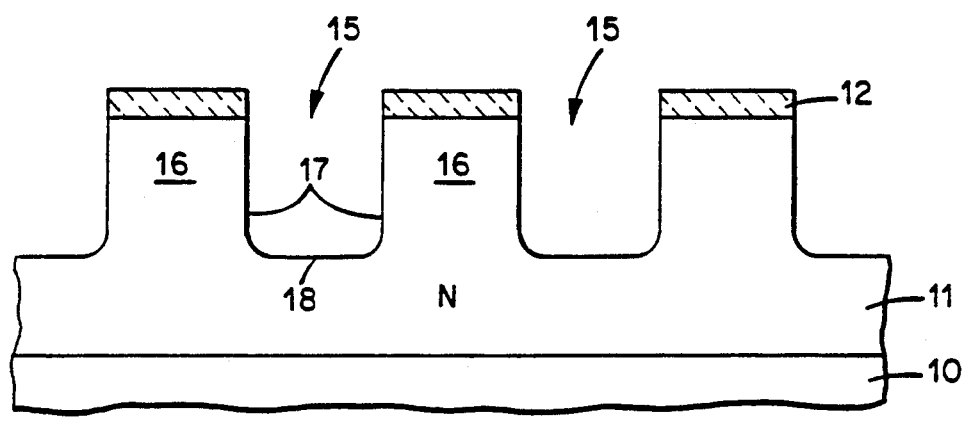

The wafer is placed in a reactive ion etching apparatus, specifically a parallel plate reactor (Plasmatherm PK244 Etcher). First, the surface is cleaned by sputtering in an argon atmosphere. Then the wafer is etched by reactive ion etching in an atmosphere of $SiCl_4$ and $Cl_2$. This etching procedure produces a very clean vertical cut of the side walls 17 of the grooves 15 which are formed, as illustrated in FIG. 2. In a subsequent step only $Cl_2$ is used as the etching atmosphere, producing the rounded corners between the side walls 17 and the bottoms 18 of the grooves 15. Thus, a plurality of elongated parallel grooves or trenches 15 are formed leaving interposed between them finger-like ridges 16 of silicon. Each of the grooves 15 has opposite side walls 17 formed by the two adjacent ridges 16 and also an end wall or bottom 18 with rounded intersections between the side walls 17 and bottoms 18.

Figure 3:
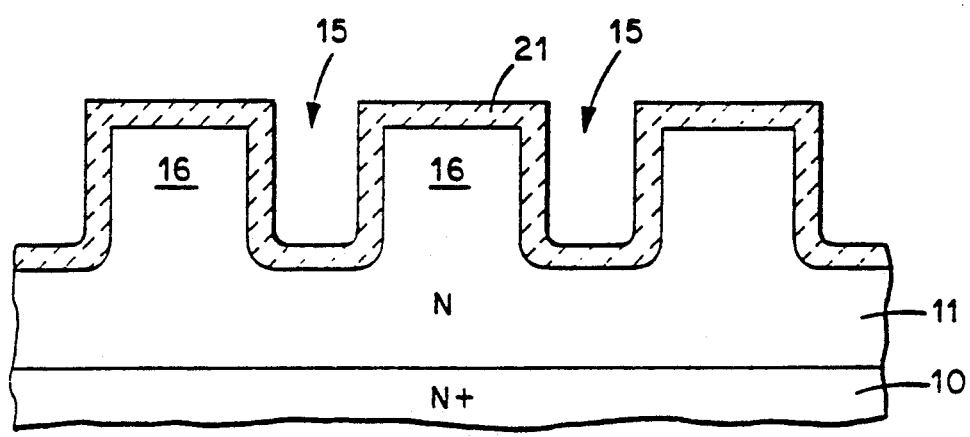

The thick masking layer of silicon oxide 12 is removed. The wafer is subjected to an oxygen atmosphere at an elevated temperatue to form a thin silicon oxide layer. Then the wafer is etched in an HF etching solution to remove all material from the surface and leave a clean silicon surface throughout. Next, the wafer is treated by heating at an elevated temperature in a dry oxygen atmosphere in accordance with known techniques to produce a grown silicon oxide layer 21. The silicon oxide layer 21 covers the entire exposed upper surfaces of the wafer including the side walls 17 and bottoms 18 of the grooves and the upper surfaces of the ridges 16, as shown in FIG. 3.

Next, fluorine is implanted into the silicon oxide layer 21. The energy of the fluorine ions is chosen to assure that the peak of the fluorine implantation is in the silicon oxide layer 21 and not in the underlying silicon.

Figure 4:
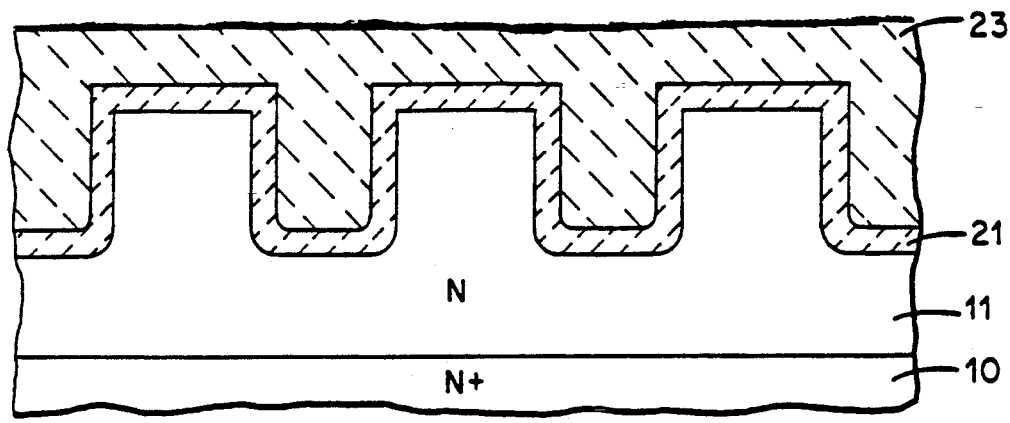
Figure 5:
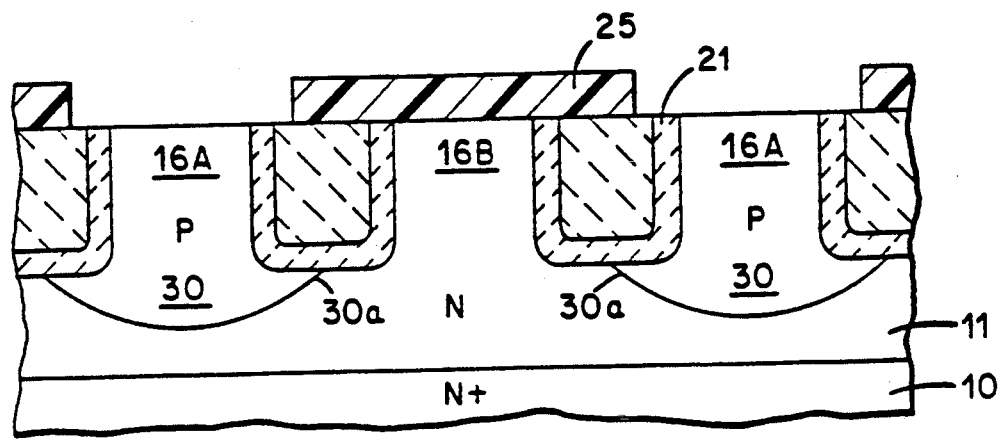

Silicon oxide 23 is deposited to fill the remainder of the grooves 15 and also to provide a planarized upper surface, (FIG. 4). Electronic cyclotron resonance (ECR) planar oxide deposition procedures may be employed. With these procedures the grooves are completely filled with silicon oxide and a flat, planar surface is obtained over the entire wafer. The wafer is etched in an HF etching solution to remove silicon oxide and expose the upper surfaces of the ridges while leaving the grooves filled. (FIG. 5).

Alternative techniques of filling the grooves and providing a flat, planar, upper surface may also be employed. For example, silicon oxide or polycrystalline silicon may be deposited by employing conventional chemical vapor deposition techniques to fill the grooves and place material on the upper surfaces. Photoresist material is placed over the surface of the deposited material and selectively removed so as to protect the deposited material overlying the grooves and to expose the deposited material overlying the ridges. The wafer is treated by an isotropic wet etch in an appropriate etching solution so as to expose the upper surfaces of the ridges 16 and produce a flat, planar, continuous surface. (FIG. 5)

With the surfaces of the ridges 16 exposed, a thin (150 angstroms) implant silicon oxide layer is grown on the surface. The implant oxide helps to prevent channeling of the ions along silicon grain boundaries. By employing known techniques, a layer of photoresist material 25 is applied to the surface of the wafer and then selectively removed to expose alternate ridges 16A while leaving protected the intervening ridges 16B as illustrated in FIG. 5. P-type conductivity imparting material is then introduced into the silicon at the exposed surfaces of the alternate ridges 16A by conventional ion implantation techniques. The photoresist layer 25 protects the remaining surface areas of the wafer.

After ion implantation the photoresist layer 25 is removed and the wafer is heated to cause the implanted conductivity type imparting material to diffuse throughout the alternate ridges 16A and laterally as well as vertically from the bases of the ridges 16A. As illustrated in FIG. 5, zones of P-type conductivity 30 are thus produced inset in the high resistivity N-type material of the epitaxial layer 11. The laterally extending portions 30a of the P-type zones 30 extend beneath the adjacent silicon oxide 23 and 21 in the grooves 15 toward the laterally extended portions 30a of the P-type zones 30 from the adjacent alternate ridges 16A.

In addition to causing diffusion of the P-type conductivity imparting material, the heat treatment also activates the fluorine ions implanted in the silicon oxide layer 21 at the side walls and bottoms of the grooves.

Figure 6:
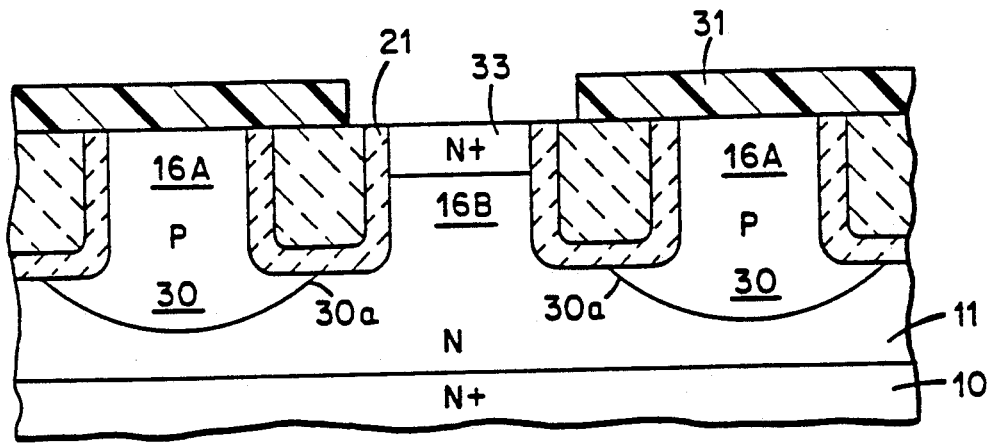

As illustrated in FIG. 6, a layer of photoresist material 31 is then placed on the surface of the wafer and selectively removed to expose the surfaces of the intervening ridges 16B. The wafer is subjected to treatment in conventional ion implantation apparatus to implant N-type conductivity material in the zones 33 at the upper surfaces of the intervening ridges 16B. The photoresist layer 31 is then removed and the wafer is annealed in order to activate the implanted ions forming the source regions 33.

Ohmic contacts 34 and 35 to the source regions 33 and gate regions 30, respectively, (FIG. 7) are then formed by any known techniques of metallization such as the formation of cobalt disilicide contacts or the selective deposition of tungsten with further metallization. The gate contacts 35 are appropriately connected together and to a gate bonding pad (not shown), and the source contacts 34 are appropriately connected together and to a source bonding pad (not shown) in a conventional manner. A metal layer 32 is applied to the bottom surface of the substrate 10 in order to provide a suitable drain contact member as illustrated in FIG. 7.

Figure 7:
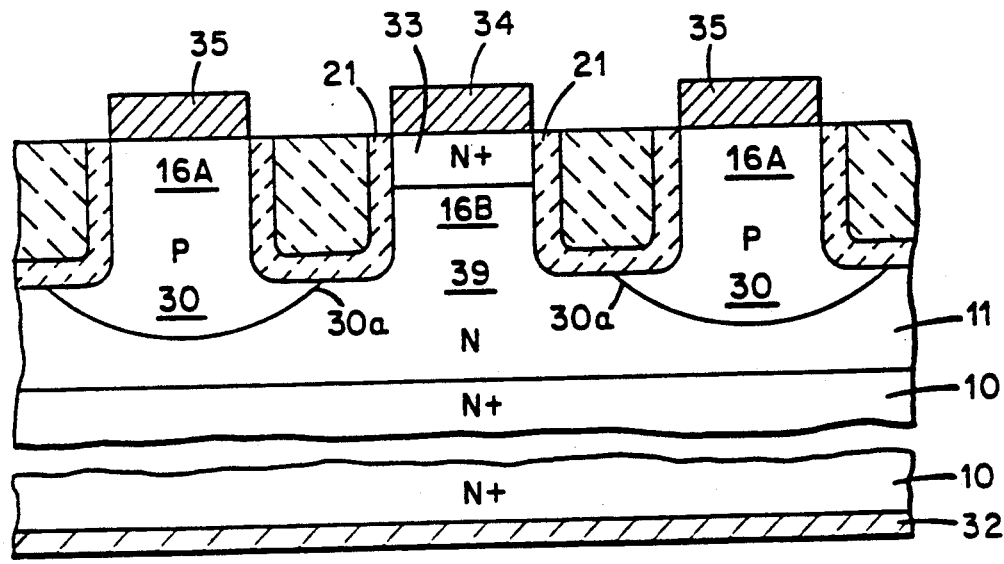

The resulting junction field effect transistor (JFET) as illustrated in FIG. 7 includes source regions 33 of low resistivity N-type silicon in the intervening ridges 16B and a drain region of low resistivity N-type silicon provided by the substrate 10. Channel regions 39 of high resistivity N-type silicon between each source region 33 and the drain region 10 lie between the laterally extending portions 30a of the P-type gate region 30.

In the fabrication of an exemplary static induction transistor in accordance with the present invention, the substrate 10 may be a slice of single crystal N-type silicon doped with antimony to provide a uniform resistivity of 0.01 to 0.05 ohm-centimeters. The N-type epitaxial layer 11 of relatively high resistivity silicon is doped with arsenic during deposition to provide a uniform resistivity of about 10 ohm-centimeters. The epitaxial layer 11 may be about 10 micrometers thick. The grooves 15 are about 0.5 to 1.5 micrometers deep and approximately 0.5 to 1.5 micrometers wide, although they might be wider if desired. The interposed ridges 16 may have a width approximately the same as the grooves. The grooves may be formed by reactive ion etching in an atmosphere which is about one-third $SiCl_4$ and two-thirds $Cl_2$, and then in an atmosphere of $Cl_2$ so as to produce slightly rounded intersections with no sharp corners between the side walls 17 and bottoms 18 of the etched grooves 15. The silicon oxide layer 21 is a dry-grown thermal oxide between 2,000 and 3,000 angstroms thick formed by heating the wafer in a dry oxygen atmosphere at a temperature of 1,000° C. The fluorine is ion-implanted into the silicon oxide layer 21 at a dose of $1\times10^{11}$ to $5\times10^{14}$ ions/cm$^2$, specifically about $1\times10^{14}$ ions/cm$^2$. The P-type gate regions 30 are formed by ion implanting and then diffusing boron into the wafer. After the boron implantation the wafer is heated at a temperature of 1,000° C. for about ten hours. As stated previously, this heat treatment diffuses the boron to form the gate regions and also activates the fluorine ions causing the fluorine ions to diffuse and react with unbonded silicon atoms thereby reducing surface state charges and limiting leakage currents. Arsenic is implanted to form the N-type source regions 33. Subsequent to implanting the arsenic ions, the wafer is treated by rapid thermal annealing at a temperature of about 1,050° C. for about 1 to 2 minutes.

The fluorine ions in the implanted silicon oxide layer at the side walls and bottoms of the grooves, when activated, diffuse to the silicon oxide-silicon interface and react with unbonded silicon atoms, thereby quenching vacant bond sites in the silicon oxide at the interface. The surface state charges are thus reduced and therefore leakage currents are also reduced thereby producing improved device performance.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a semiconductor device structure comprising
   providing a body of silicon;
   forming a groove in said body at a surface thereof;
   forming layers of silicon oxide on the side walls and bottom of said groove;
   introducing fluorine into said layers of silicon oxide; and
   heating to activate said fluorine.

2. The method in accordance with claim 1 wherein forming a groove in said body includes
   placing a layer of masking material on the surface of the body to expose a surface area in the pattern of said groove; and
   reactive ion etching exposed silicon to form said groove.

3. The method in accordance with claim 2 wherein forming layers of silicon oxide includes
   exposing the body of silicon to oxygen at an elevated temperature to grow silicon oxide on the side walls and bottom of the groove.

4. The method in accordance with claim 3 wherein reactive ion etching includes
   reactive ion etching the body in an atmosphere consisting essentially of SiCl$_4$ and Cl$_2$; and subsequently reactive ion etching the body in an atmosphere consisting essentially of Cl$_2$.

5. The method in accordance with claim 4 including filling the remainder of said groove with silicon oxide subsequent to introducing fluorine into said layers of silicon oxide.

6. The method in accordance with claim 4 including filling the remainder of said groove with polycrystalline silicon subsequent to introducing fluorine into said layer of silicon oxide.

7. The method of fabricating a junction field effect transistor comprising
   providing a body of silicon including a first layer of one conductivity type of relatively high resistivity and a second layer of the one conductivity type of relatively low resistivity contiguous with said first layer, said first layer having a surface at a surface of the body;
   forming a plurality of grooves through said surface into said first layer of silicon producing interposed ridges of silicon, each of aid grooves having side walls formed by the adjacent ridges of silicon and having a bottom; alternate ridges being gate ridges and intervening ridges being source ridges;
   forming layers of silicon oxide on the side walls and bottoms of said grooves;
   introducing fluorine into said layers of silicon oxide;
   filling the remainder of said grooves with a nonconductive protective material and producing a continuous surface with exposed surfaces of the gate and source ridges;
   introducing conductivity type imparting material of the opposite conductivity type into the gate ridges of silicon at the surfaces to convert zones of said first layer to said opposite conductivity type thereby forming gate regions of the opposite conductivity type;
   introducing conductivity type imparting material of the one conductivity type into the source ridges of silicon at the surfaces to produce a source region of the one conductivity type of relatively low resistivity in a zone adjacent to the surface in each of said source ridges; and
   applying conductive material to form electrical contacts in ohmic contact with said source and gate regions at the surfaces of said source and gate ridges, respectively.

8. The method in accordance with claim 7 wherein forming layers of silicon oxide includes
   exposing the body of silicon to oxygen at an elevated temperature to grow silicon oxide on the side walls and bottoms of the grooves.

9. The method in accordance with claim 8 wherein introducing fluorine into said layers of silicon oxide includes
   ion implanting fluorine into said layers of silicon oxide.

10. The method in accordance with claim 9 wherein introducing conductivity type imparting material of the opposite conductivity type into the gate ridges of silicon includes
    ion implanting conductivity type imparting material of the opposite conductivity type into the gate regions at the surface thereof; and
    heating to diffuse ion-implanted conductivity type imparting material of the opposite conductivity type into the zones of said first layer and to activate said fluorine.

11. The method in accordance with claim 10 wherein forming a plurality of grooves includes
    placing a layer of masking material on the surface of the body to expose a plurality of surface areas in the pattern of said grooves; and reactive ion etching exposed silicon to form said plurality of grooves.

12. The method in accordance with claim 11 wherein reactive ion etching includes
   reactive ion etching the body in an atmosphere consisting essentially of $SiCl_4$ and $Cl_2$; and subsequently
   reactive ion etching the body in an atmosphere consisting essentially of $Cl_2$.

13. The method in accordance with claim 12 wherein said nonconductive protective material is silicon oxide.

14. The method in accordance with claim 12 wherein said nonconductive protective material is polycrystalline silicon.

15. The method in accordance with claim 12 wherein fluorine is implanted in a concentration of between $1 \times 10^{11}$ and $5 \times 10^{14}$ ions/cm$^2$.

* * * * *